United States Patent
Jung et al.

(10) Patent No.: US 10,578,927 B2
(45) Date of Patent: Mar. 3, 2020

(54) METHOD FOR MANUFACTURING SPACERS AND METHOD FOR MANUFACTURING DISPLAY SUBSTRATE

(71) Applicant: BOE TECHNOLOGY GROUP CO., LTD., Beijing (CN)

(72) Inventors: Bongkwan Jung, Beijing (CN); Weijie Wang, Beijing (CN); Qinghui Zeng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 123 days.

(21) Appl. No.: 15/743,025

(22) PCT Filed: Jul. 12, 2017

(86) PCT No.: PCT/CN2017/092617
§ 371 (c)(1),
(2) Date: Jan. 9, 2018

(87) PCT Pub. No.: WO2018/032913
PCT Pub. Date: Feb. 22, 2018

(65) Prior Publication Data
US 2018/0239179 A1    Aug. 23, 2018

(30) Foreign Application Priority Data

Aug. 17, 2016 (CN) .......................... 2016 1 0681530

(51) Int. Cl.
*G02F 1/1339* (2006.01)
*G03F 7/30* (2006.01)
(Continued)

(52) U.S. Cl.
CPC .............. *G02F 1/1339* (2013.01); *G03F 7/30* (2013.01); *G03F 7/38* (2013.01); *G03F 7/40* (2013.01);
(Continued)

(58) Field of Classification Search
CPC . G02F 2001/13396; G02F 2001/13398; G02F 1/13394; G02F 1/1339; G03F 7/30; G03F 7/35; G03F 7/38; G03F 7/40
See application file for complete search history.

(56) References Cited

U.S. PATENT DOCUMENTS

2004/0114087 A1   6/2004   Cho et al.
2012/0081641 A1*  4/2012   Noh ................... G02F 1/13394
                                                          349/106
(Continued)

FOREIGN PATENT DOCUMENTS

CN          1497299 A      5/2004
CN        102445792 A      5/2012
(Continued)

OTHER PUBLICATIONS

Search Report for International Application No. PCT/CN2017/092617 dated Oct. 12, 2017.
(Continued)

*Primary Examiner* — Jessica M Merlin
(74) *Attorney, Agent, or Firm* — Calfee, Halter & Griswold LLP

(57) ABSTRACT

A method for manufacturing spacers and a method for manufacturing a display substrate are disclosed. The method for manufacturing spacers includes performing an over-development process on the photoresist layer processed by the exposure process to form a first photoresist pattern and a second photoresist pattern on the substrate; an outer edge of a lower portion of the first photoresist pattern near the substrate is provided with a recess, and an outer edge of a lower portion of the second photoresist pattern near the substrate is provided with a recess; waiting a first duration for photoresist on a surface of the first photoresist pattern to flow downwards to fill the recess of the first photoresist pattern, and photoresist on a surface of the second photoresist pattern to flow downwards to fill the recess of the second photoresist pattern.

20 Claims, 3 Drawing Sheets

(51) Int. Cl.
G03F 7/40 (2006.01)
G03F 7/38 (2006.01)

(52) U.S. Cl.
CPC ............... *G02F 1/13394* (2013.01); *G02F 2001/13396* (2013.01); *G02F 2001/13398* (2013.01)

(56) References Cited

U.S. PATENT DOCUMENTS

2016/0306210 A1* 10/2016 Oh .................. G02F 1/13394
2016/0313639 A1* 10/2016 Hsu .................. G03F 7/0007
2016/0320663 A1   11/2016 Hao et al.
2017/0261783 A1*  9/2017 Sato ................. G02F 1/1337
2018/0321535 A1* 11/2018 Kim ................. G02F 1/13394

FOREIGN PATENT DOCUMENTS

| CN | 104865729 A  |   | 8/2015  |
| CN | 105527801 A  | * | 4/2016  |
| CN | 105527801 A  |   | 4/2016  |
| CN | 106094427 A  |   | 11/2016 |
| JP | 2004280006 A |   | 10/2004 |

OTHER PUBLICATIONS

First Office Action for Chinese Patent Application No. 201610681530.6 dated Apr. 10, 2018.

* cited by examiner

METHOD FOR MANUFACTURING SPACERS AND METHOD FOR MANUFACTURING DISPLAY SUBSTRATE

RELATED APPLICATIONS

The present application is the U.S. national phase entry of the international application PCT/CN2017/092617, with an international filing date of Jul. 12, 2017, which claims the benefit of Chinese Patent Application No. 201610681530.6, filed on Aug. 17, 2016, the entire disclosures of which are incorporated herein by reference.

TECHNICAL FIELD

The present disclosure relates to the field of display technology, and particularly to a method for manufacturing spacers and a method for manufacturing a display substrate.

BACKGROUND

Liquid crystal display devices have been widely used because of their low power consumption, thinness and light weight. The liquid crystal display device comprises a liquid crystal cell, which comprises two oppositely arranged glass substrates and a liquid crystal layer located between the two glass substrates.

Currently, the two glass substrates are supported by a plurality of spacers so that a space for containing liquid crystal is formed between the two glass substrates. However, the current process of manufacturing the spacers between the two glass substrates is complicated, resulting in a high cost of manufacturing the spacers.

SUMMARY

In order to simplify the process of manufacturing spacers and reduce the cost of manufacturing spacers, the embodiment of the present disclosure provides a method for manufacturing spacers. The technical solution is as follows.

In an aspect, a method for manufacturing spacers is provided. The manufacturing method comprises: forming a photoresist layer on a substrate; performing an exposure process on the photoresist layer using a mask plate; performing an over-development process on the photoresist layer processed by the exposure process to form a first photoresist pattern and a second photoresist pattern on the substrate; in a direction perpendicular to the substrate as a height direction, at a position of the same height, an area of a cross-section of the first photoresist pattern is greater than an area of a cross-section of the second photoresist pattern; an outer edge of a lower portion of the first photoresist pattern near the substrate is provided with a recess, and an outer edge of a lower portion of the second photoresist pattern near the substrate is provided with a recess; waiting a first duration for photoresist on a surface of the first photoresist pattern to flow downwards to fill the recess of the first photoresist pattern, and photoresist on a surface of the second photoresist pattern to flow downwards to fill the recess of the second photoresist pattern; post-baking the first photoresist pattern and the second photoresist pattern to form a first spacer and a second spacer, a height of the first spacer being greater than a height of the second spacer.

In certain exemplary embodiments, the mask plate is composed of a completely transparent region and an opaque region.

In certain exemplary embodiments, the method for manufacturing spacers further comprises: in the step of waiting the first duration, performing a water-washing process on the first photoresist pattern and the second photoresist pattern; after the water-washing process, performing a drying process on the first photoresist pattern and the second photoresist pattern using an air knife.

In certain exemplary embodiments, the method for manufacturing spacers further comprises: before the step of performing the over-development process on the photoresist layer processed by the exposure process, spraying a developing solution on the photoresist layer processed by the exposure process to over-develop the photoresist layer processed by the exposure process with the developing solution.

In certain exemplary embodiments, a processing time of the over-development process on the photoresist layer processed by the exposure process is no less than 96 seconds and no more than 144 seconds.

In certain exemplary embodiments, the processing time is approximately 100 seconds, 110 seconds, 120 seconds, 130 seconds or 140 seconds.

In certain exemplary embodiments, the method for manufacturing spacers further comprises: before the step of performing the over-development process on the photoresist layer processed by the exposure process, immersing the substrate and the photoresist layer processed by the exposure process in a developing solution to over-develop the photoresist layer processed by the exposure process with the developing solution.

In certain exemplary embodiments, the method for manufacturing spacers further comprises: before the step of performing the exposure process on the photoresist layer using the mask plate, pre-baking the photoresist layer to make the photoresist layer viscous.

In certain exemplary embodiments, the first duration is no less than 50 seconds and no more than 70 seconds.

In certain exemplary embodiments, the first duration is approximately 55 seconds, 60 seconds or 65 seconds.

An embodiment of the disclosure further provides a method for manufacturing a display substrate. The method for manufacturing the display substrate includes the above mentioned method for manufacturing spacers.

In the embodiments of the present disclosure, by over-developing the photoresist layer processed by the exposure process, a first photoresist pattern and a second photoresist pattern are formed. In addition, an outer edge of a lower portion of the first photoresist pattern near the substrate is provided with a recess, and an outer edge of a lower portion of the second photoresist pattern near the substrate is provided with a recess. After the first duration, the photoresist on a surface of the first photoresist pattern flows downwards to fill the recess of the first photoresist pattern, and the photoresist on a surface of the second photoresist pattern flows downwards to fill the recess of the second photoresist pattern. In this way, the mask plate used in manufacturing spacers can be a common mask plate including a completely transparent region and an opaque region, so that the process can be simplified and the production cost can be reduced.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

To make the objectives, technical solutions, and advantages of the present disclosure clearer, the embodiments of the present disclosure are further described in detail below with reference to the accompanying drawings.

Embodiment 1

Figure 1:
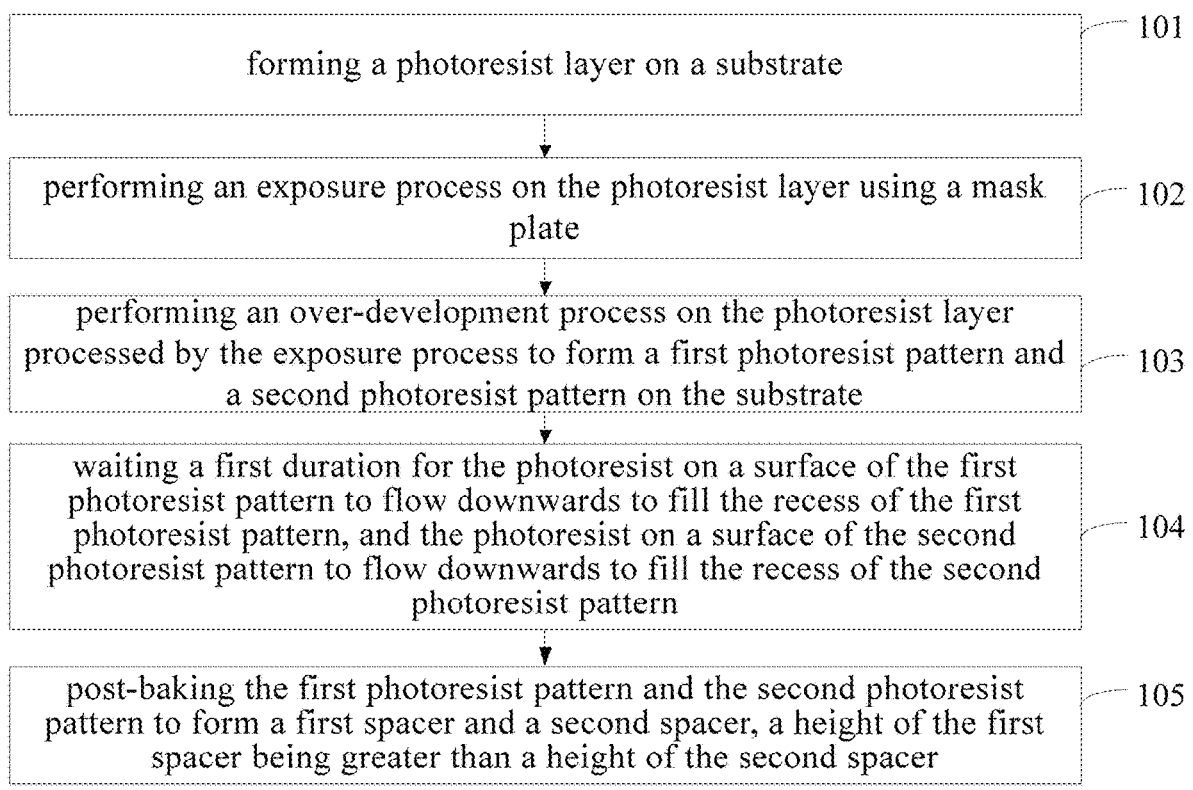
FIG. 1 is a flow chart of a method for manufacturing spacers according to embodiment 1 of the disclosure.

Referring to FIG. 1, an embodiment of the present disclosure provides a method for manufacturing spacers. The manufacturing method comprises the following steps.

Step 101: forming a photoresist layer on a substrate.

Step 102: performing an exposure process on the photoresist layer using a mask plate.

Step 103: performing an over-development process on the photoresist layer processed by the exposure process to form a first photoresist pattern and a second photoresist pattern on the substrate. In a direction perpendicular to the substrate as a height direction, at a position of the same height, an area of a cross-section of the first photoresist pattern is greater than an area of a cross-section of the second photoresist pattern. An outer edge of a lower portion of the first photoresist pattern near the substrate is provided with a recess, and an outer edge of a lower portion of the second photoresist pattern near the substrate is provided with a recess.

Step 104: waiting a first duration for photoresist on a surface of the first photoresist pattern to flow downwards to fill the recess of the first photoresist pattern, and photoresist on a surface of the second photoresist pattern to flow downwards to fill the recess of the second photoresist pattern.

Step 105: post-baking the first photoresist pattern and the second photoresist pattern to form a first spacer and a second spacer. A height of the first spacer is greater than a height of the second spacer.

In certain exemplary embodiments, the mask plate is composed of a completely transparent region and an opaque region. The first duration is no less than 50 seconds and no more than 70 seconds. For example, the first duration is approximately 55 seconds, 60 seconds or 65 seconds, etc.

In certain exemplary embodiments, the method for manufacturing spacers further comprises: in the step of waiting the first duration, performing a water-washing process on the first photoresist pattern and the second photoresist pattern; after the water-washing process, performing a drying process on the first photoresist pattern and the second photoresist pattern using an air knife.

In certain exemplary embodiments, the method for manufacturing spacers further comprises: before step 103, spraying a developing solution on the photoresist layer processed by the exposure process to over-develop the photoresist layer processed by the exposure process with the developing solution.

In certain exemplary embodiments, a processing time of the over-development process on the photoresist layer processed by the exposure process is no less than 96 seconds and no more than 144 seconds. For example, the processing time is approximately 100 seconds, 110 seconds, 120 seconds, 130 seconds or 140 seconds, etc.

In certain exemplary embodiments, the method for manufacturing spacers further comprises: before step 103, immersing the substrate and the photoresist layer processed by the exposure process in a developing solution to over-develop the photoresist layer processed by the exposure process with the developing solution.

In certain exemplary embodiments, the method for manufacturing spacers further comprises: before step 102, pre-baking the photoresist layer to make the photoresist layer viscous.

In the embodiments of the present disclosure, by over-developing the photoresist layer processed by the exposure process, a first photoresist pattern and a second photoresist pattern are formed. In addition, an outer edge of a lower portion of the first photoresist pattern near the substrate is provided with a recess, and an outer edge of a lower portion of the second photoresist pattern near the substrate is provided with a recess. After the first duration, the photoresist on a surface of the first photoresist pattern flows downwards to fill the recess of the first photoresist pattern, and the photoresist on a surface of the second photoresist pattern flows downwards to fill the recess of the second photoresist pattern. In this way, the mask plate used in manufacturing spacers can be a common mask plate including a completely transparent region and an opaque region, so that the process can be simplified and the production cost can be reduced. In addition, the photoresist layer is pre-baked before exposure to evaporate a portion of the solvent contained in the photoresist of the photoresist layer, making the photoresist more viscous, and this is advantageous for the shaping of the photoresist layer.

Embodiment 2

Figure 2A:
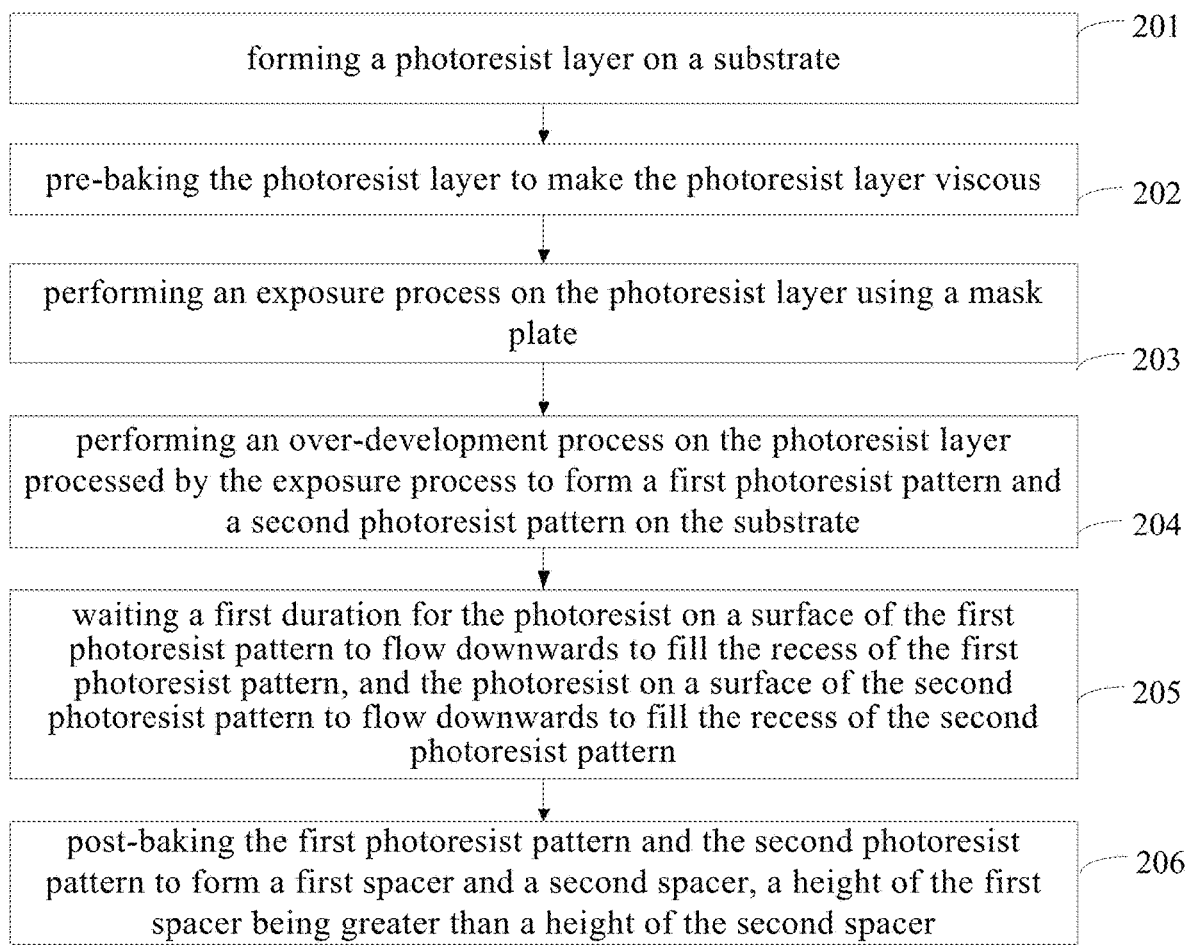
FIG. 2a is a flow chart of a method for manufacturing spacers according to embodiment 2 of the disclosure.

Referring to FIG. 2a, an embodiment of the present disclosure provides a method for manufacturing spacers. The manufacturing method comprises the following steps.

Step 201: forming a photoresist layer on a substrate.

Figure 2B:
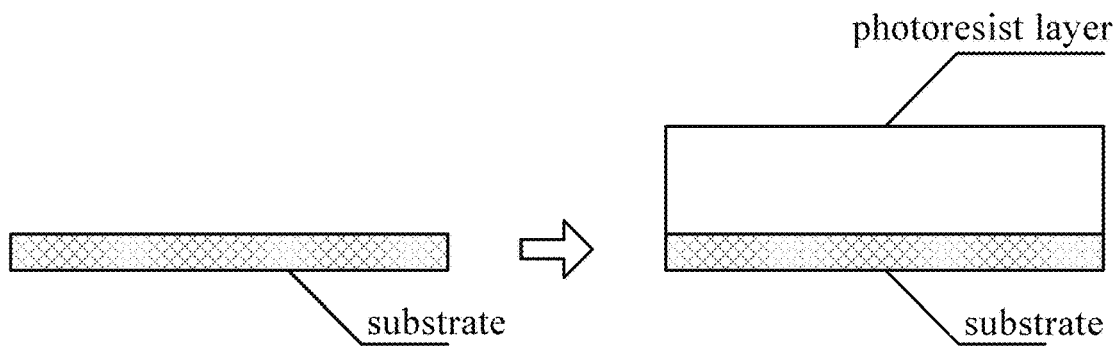
FIG. 2b is a schematic diagram of forming a photoresist layer according to embodiment 2 of the present disclosure.

The substrate can be a glass substrate. Referring to FIG. 2b, a photoresist is first coated on the substrate till the thickness of the photoresist layer on the substrate reaches a preset thickness threshold. A photoresist layer is then formed on the substrate.

In certain exemplary embodiments, the preset thickness threshold can be greater than or equal to 3 micrometers, and less than or equal to 4 micrometers. In certain exemplary embodiments, the preset thickness threshold is approximately 3 micrometers, 3.3 micrometers, 3.5 micrometers, 3.7 micrometers, or 4 micrometers, etc.

Step 202: pre-baking the photoresist layer on the substrate to make the photoresist layer viscous.

Photoresist is a viscous liquid containing a large amount of solvent. After the photoresist layer is formed on the substrate, the photoresist can easily deform the photoresist layer under the action of gravity. At the edge of the photoresist layer, the photoresist deform the edge of the photoresist layer under the action of gravity more easily. For this reason, in this step, the photoresist layer is pre-baked to evaporate a portion of the solvent contained in the photoresist of the photoresist layer, making the photoresist more viscous, and this is advantageous for the shaping of the photoresist layer.

Step 203: performing an exposure process on the photoresist layer using a mask plate.

Before performing this step, the mask plate needs to be provided first. The mask plate used in this step can be a conventional mask plate, which includes a completely transparent region and an opaque region. The production cost of the conventional mask plate is lower than the production cost of a special mask plate, and the manufacturing process is also simpler than that of the special mask plate, since the special mask plate includes a completely transparent region, a semi-transparent region and an opaque region. Therefore, this embodiment can reduce the manufacturing cost and process difficulty of the spacers.

The completely transparent region of the mask plate includes at least one first completely transparent region corresponding to the first spacer and at least one second completely transparent region corresponding to the second spacer. The area of the first completely transparent area is greater than the area of the second completely transparent area.

After the photoresist layer is exposed, the photoresist layer includes at least one first exposed region corresponding to the first spacer and at least one second exposed region corresponding to the second spacer. When a negative photoresist is used, after the exposure process, the density and stiffness of the exposed photoresist is much greater than those of other unexposed photoresist.

Step 204: performing an over-development process on the photoresist layer processed by the exposure process to form a first photoresist pattern and a second photoresist pattern on the substrate. In a direction perpendicular to the substrate as a height direction, at a position of the same height, an area of a cross-section of the first photoresist pattern is greater than an area of a cross-section of the second photoresist pattern. An outer edge of a lower portion of the first photoresist pattern near the substrate is provided with a recess, and an outer edge of a lower portion of the second photoresist pattern near the substrate is provided with a recess.

The way of over-developing the photoresist layer processed by the exposure process includes spraying a developing solution and immersing in a developing solution.

The implementation of spraying a developing solution can be realized by spraying a developing solution on the photoresist layer processed by the exposure process to over-develop the photoresist layer processed by the exposure process with the developing solution.

The implementation of immersing in a developing solution can be realized by immersing the substrate and the photoresist layer processed by the exposure process in a developing solution to over-develop the photoresist layer processed by the exposure process with the developing solution.

The processing time of the over-development process is longer than the processing time of the normal development process. Generally, the processing time for over-development is 10% to 30% longer than that of the normal development process. For example, processing time for over-development can be 10%, 15%, 20%, 25% or 30% longer than that of the normal development process.

It is assumed that the processing time of the over-development process is 20% longer than the processing time of the normal development process. For the implementation of spraying a developing solution, the processing time required for the normal development process is greater than or equal to 80 seconds and less than or equal to 120 seconds, then the processing time of the over-development process is greater than or equal to 96 seconds and less than or equal to 144 seconds. In certain exemplary embodiments, the processing time of the over-development process is approximately 100 seconds, 110 seconds, 120 seconds, 130 seconds or 140 seconds, etc.

For the implementation of immersing in a developing solution, the processing time required for the normal development process is greater than or equal to 60 seconds and less than or equal to 100 seconds, then the processing time of the over-development process is greater than or equal to 72 seconds and less than or equal to 120 seconds. In certain exemplary embodiments, the processing time of the over-development process is approximately 75 seconds, 80 seconds, 90 seconds, 100 seconds or 110 seconds, etc.

Figure 2C:
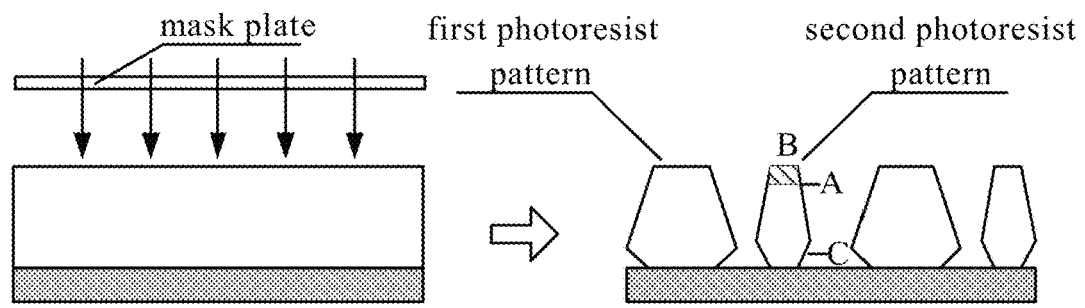
FIG. 2c is a schematic diagram of forming a first photoresist pattern and a second photoresist pattern according to embodiment 2 of the present disclosure.

It should be noted that, firstly, in this embodiment, a negative photoresist is used, that is, a developing solution has a slower etching rate to an exposed photoresist than a photoresist that has not been exposed to light. In fact, positive photoresists can also be used. Secondly, the developing solution is corrosive and capable of etching the photoresist in the photoresist layer processed by the exposure process. Since the molecular density and the hardness of the photoresist in the first exposed region and the photoresist in the second exposed region within the photoresist layer processed by the exposure process are both high, the photoresist in the first exposed region and the photoresist in the second exposed region are etched slower by the developing solution. Referring to FIG. 2c, during the development process, the developing solution will etch away the photoresist around the first exposed region to form a first photoresist pattern and etch away the photoresist around the second exposed region to form a second photoresist pattern.

Since the over-development process is performed on the photoresist, the first photoresist pattern has a circle of recess at the outer edge of the lower portion of the first photoresist pattern near the substrate, and the second photoresist pattern also has a circle of recess at the outer edge of the lower portion of the second photoresist pattern near the substrate.

The photoresist volume of the second photoresist pattern from the first height A to the top B is less than or equal to the recess volume at the outer edge of the lower portion of the second photoresist pattern. For example, referring to FIG. 2c, for the second photoresist pattern, the photoresist volume from the first height A to the top B is less than or equal to the recess volume at the outer edge of the lower portion of the second photoresist pattern.

In certain exemplary embodiments, a distance from the first height A to the top B is approximately 0.5 micrometers.

Step 205: waiting a first duration for photoresist on a surface of the first photoresist pattern to flow downwards to fill the recess of the first photoresist pattern, and photoresist on a surface of the second photoresist pattern to flow downwards to fill the recess of the second photoresist pattern.

Figure 2D:
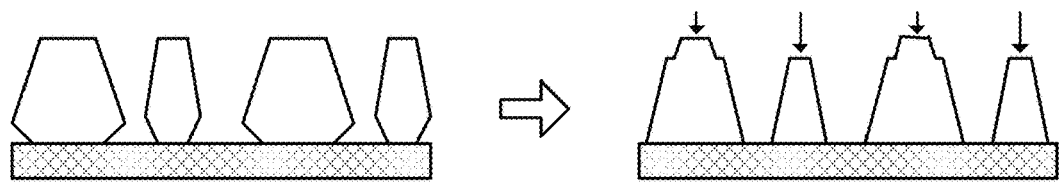
FIG. 2d is a schematic diagram showing the flow of a photoresist according to embodiment 2 of the present disclosure.
Figure 2E:
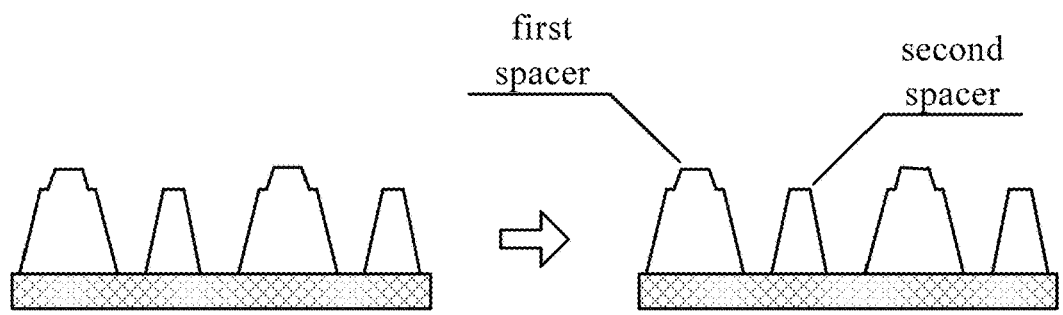
FIG. 2e is a schematic diagram of forming a first spacer and a second spacer according to embodiment 2 of the present disclosure.

Referring to FIG. 2d, since the first photoresist pattern has a recess at the outer edge of the lower portion, the photoresist on the surface of the first photoresist pattern flows downwards under the action of gravity and fills the recess at the outer edge of the lower portion of the first photoresist pattern. It should be noted that the photoresist on the surface of the first photoresist pattern may not flow downwards if there is no recess at the outer edge of the lower portion of the first photoresist pattern. In addition, since the second photoresist pattern has a recess at the outer edge of the lower portion, the photoresist on the surface of the second photoresist pattern flows downwards under the action of gravity and fills the recess at the outer edge of the lower portion of the second photoresist pattern. It should be noted that the photoresist on the surface of the second photoresist pattern may not flow downwards if there is no recess at the outer edge of the lower portion of the second photoresist pattern.

As shown in FIG. 2d, since the area of the top surface of the second photoresist pattern is relatively small, the photoresist located on the top of the second photoresist pattern will flow downwards so that the height of the second photoresist pattern is more significantly reduced. Therefore the height of the finally formed second spacer is less than the height of the first spacer.

In certain exemplary embodiments, in the step of waiting the first duration, a water-washing process can be performed on the first photoresist pattern and the second photoresist pattern, thereby cleaning the developing solution on the surfaces of the first photoresist pattern and the second photoresist pattern, so as to prevent the developing solution on the surfaces of the first photoresist pattern and the second photoresist pattern from etching the first photoresist pattern and the second photoresist pattern again. After the water-washing process, a drying process can be performed on the first photoresist pattern and the second photoresist pattern using an air knife.

In certain exemplary embodiments, the first duration is no less than 50 seconds and no more than 70 seconds. For example, the first duration is approximately 55 seconds, 60 seconds or 65 seconds, etc.

Step 206: post-baking the first photoresist pattern and the second photoresist pattern to form a first spacer and a second spacer. A height of the first spacer is greater than a height of the second spacer.

After forming the solid first spacer and the solid second spacer by applying the post-baking process, the first spacer and the second spacer can be used for supporting these two substrates.

An embodiment of the disclosure further provides a method for manufacturing a display substrate. The method for manufacturing the display substrate includes the above mentioned method for manufacturing spacers. The implementation of the method for manufacturing the display substrate can refer to the embodiments of the method for manufacturing spacers, which will not be repeated herein.

In the embodiments of the present disclosure, by over-developing the photoresist layer processed by the exposure process, a first photoresist pattern and a second photoresist pattern are formed. In addition, an outer edge of a lower portion of the first photoresist pattern near the substrate is provided with a recess, and an outer edge of a lower portion of the second photoresist pattern near the substrate is provided with a recess. After the first duration, the photoresist on a surface of the first photoresist pattern flows downwards to fill the recess of the first photoresist pattern, and the photoresist on a surface of the second photoresist pattern flows downwards to fill the recess of the second photoresist pattern. In this way, the mask plate used in manufacturing spacers can be a common mask plate including a completely transparent region and an opaque region, so that the process can be simplified and the production cost can be reduced. In addition, the photoresist layer is pre-baked before exposure to evaporate a portion of the solvent contained in the photoresist of the photoresist layer, making the photoresist more viscous, and this is advantageous for the shaping of the photoresist layer.

The sequence numbers of the foregoing embodiments of the present disclosure are merely for the purpose of description and do not represent the advantages and disadvantages of the embodiments.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. A method for manufacturing spacers, comprising:
    forming a photoresist layer on a substrate;
    performing an exposure process on the photoresist layer using a mask plate;
    performing an over-development process on the photoresist layer processed by the exposure process to form a first photoresist pattern and a second photoresist pattern on the substrate; in a direction perpendicular to the substrate as a height direction, at a position of the same height, an area of a cross-section of the first photoresist pattern is greater than an area of a cross-section of the second photoresist pattern; an outer edge of a lower portion of the first photoresist pattern near the substrate is provided with a recess, and an outer edge of a lower portion of the second photoresist pattern near the substrate is provided with a recess;
    waiting a first duration for photoresist on a surface of the first photoresist pattern to flow downwards to fill the recess of the first photoresist pattern, and photoresist on a surface of the second photoresist pattern to flow downwards to fill the recess of the second photoresist pattern; and
    post-baking the first photoresist pattern and the second photoresist pattern to form a first spacer and a second spacer, a height of the first spacer being greater than a height of the second spacer.

2. The method for manufacturing spacers according to claim 1, wherein the mask plate is composed of a completely transparent region and an opaque region.

3. The method for manufacturing spacers according to claim 2, further comprising: in the step of waiting the first duration, performing a water-washing process on the first photoresist pattern and the second photoresist pattern; after the water-washing process, performing a drying process on the first photoresist pattern and the second photoresist pattern using an air knife.

4. The method for manufacturing spacers according to claim 1, further comprising: before the step of performing the over-development process on the photoresist layer processed by the exposure process, spraying a developing solution on the photoresist layer processed by the exposure process to over-develop the photoresist layer processed by the exposure process with the developing solution.

5. The method for manufacturing spacers according to claim 4, wherein a processing time of the over-development process on the photoresist layer processed by the exposure process is no less than 96 seconds and no more than 144 seconds.

6. The method for manufacturing spacers according to claim 5, wherein the processing time is approximately 100 seconds, 110 seconds, 120 seconds, 130 seconds or 140 seconds.

7. The method for manufacturing spacers according to claim 1, further comprising: before the step of performing the over-development process on the photoresist layer processed by the exposure process, immersing the substrate and the photoresist layer processed by the exposure process in a developing solution to over-develop the photoresist layer processed by the exposure process with the developing solution.

8. The method for manufacturing spacers according to claim 1, further comprising: before the step of performing the exposure process on the photoresist layer using the mask plate, pre-baking the photoresist layer to make the photoresist layer viscous.

9. The method for manufacturing spacers according to claim 1, wherein the first duration is no less than 50 seconds and no more than 70 seconds.

10. The method for manufacturing spacers according to claim 9, wherein the first duration is approximately 55 seconds, 60 seconds or 65 seconds.

11. A method for manufacturing a display substrate comprising the method for manufacturing spacers according to claim 1.

12. The method for manufacturing a display substrate according to claim 11, wherein the mask plate is composed of a completely transparent region and an opaque region.

13. The method for manufacturing a display substrate according to claim 12, further comprising: in the step of waiting the first duration, performing a water-washing process on the first photoresist pattern and the second photoresist pattern; after the water-washing process, performing a drying process on the first photoresist pattern and the second photoresist pattern using an air knife.

14. The method for manufacturing a display substrate according to claim 11, further comprising: before the step of performing the over-development process on the photoresist layer processed by the exposure process, spraying a developing solution on the photoresist layer processed by the exposure process to over-develop the photoresist layer processed by the exposure process with the developing solution.

15. The method for manufacturing a display substrate according to claim 14, wherein a processing time of the over-development process on the photoresist layer processed by the exposure process is no less than 96 seconds and no more than 144 seconds.

16. The method for manufacturing a display substrate according to claim 15, wherein the processing time is approximately 100 seconds, 110 seconds, 120 seconds, 130 seconds or 140 seconds.

17. The method for manufacturing a display substrate according to claim 11, further comprising: before the step of performing the over-development process on the photoresist layer processed by the exposure process, immersing the substrate and the photoresist layer processed by the exposure process in a developing solution to over-develop the photoresist layer processed by the exposure process with the developing solution.

18. The method for manufacturing a display substrate according to claim 11, further comprising: before the step of performing the exposure process on the photoresist layer using the mask plate, pre-baking the photoresist layer to make the photoresist layer viscous.

19. The method for manufacturing a display substrate according to claim 11, wherein the first duration is no less than 50 seconds and no more than 70 seconds.

20. The method for manufacturing a display substrate according to claim 19, wherein the first duration is approximately 55 seconds, 60 seconds or 65 seconds.

* * * * *